United States Patent [19]

Stewart

[11] Patent Number: 5,563,915
[45] Date of Patent: Oct. 8, 1996

[54] DATA DEINTERLEAVER IN A DIGITAL TELEVISION SIGNAL DECODING SYSTEM

[75] Inventor: John S. Stewart, Indianapolis, Ind.

[73] Assignee: Thomson Consumer Electronics Inc., Indianapolis, Ind.

[21] Appl. No.: 346,950

[22] Filed: Nov. 30, 1994

[51] Int. Cl.$^6$ .................................................. H03D 1/00
[52] U.S. Cl. ........................ 375/340; 375/316; 375/354; 375/356; 348/426; 348/469; 348/613; 348/714; 348/718; 370/68
[58] Field of Search .................................. 395/162–166, 395/401, 427, 428, 481, 482, 484; 348/403–405, 448, 469, 500–501, 507, 521–523, 555, 567–568, 613, 714–716, 718–721; 345/200, 203; 375/316, 324, 340, 354, 356; 370/68

[56] References Cited

U.S. PATENT DOCUMENTS

| | | | |
|---|---|---|---|
| 5,134,464 | 7/1992 | Basile et al. | 348/487 |
| 5,430,767 | 7/1995 | Min | 375/340 |
| 5,475,716 | 12/1995 | Huang | 375/354 |

OTHER PUBLICATIONS

"Burst–Correcting Codes for the Classic Bursty Channel", IEEE Transactions on Communications Technology, vol. COM–19, Oct. 1971, pp. 772–781, G. David Forney.

"Realization of Optimum Interleavers", IEEE Transactions on Information Theory, vol. IT–15, May 1970, pp. 338–345, John L. Ramsey.

"Error Correction Coding for Digital Communications", pp. 345–348, George Clark & J. Cain, Plenum Press, Jun. 1981.

Grand Alliance HDTV System Specification, Version 1.0, Apr. 14, 1994.

*Primary Examiner*—Kee Mei Tung
*Attorney, Agent, or Firm*—Joseph S. Tripoli; Eric P. Herrmann; Ronald H. Kurdyla

[57] ABSTRACT

A television signal receiving system includes a deinterleaving network (18) containing first and second deinterleaving functions associated with respective memory address controllers (20, 25). One or the other of the deinterleaving functions is selected for use by a multiplexer (30) in response to a Deinterleaver Select control signal. Deinterleaving is accomplished by controlling the read/write addressing of a memory (35) by the selected deinterleaving function.

9 Claims, 2 Drawing Sheets

DATA DEINTERLEAVER IN A DIGITAL TELEVISION SIGNAL DECODING SYSTEM

FIELD OF THE INVENTION

This invention is related to the field of digital signal processing, and more particularly to a video signal deinterleaver included in a system for decoding a television signal such as a high definition television signal.

BACKGROUND OF THE INVENTION

Advanced video signal processing systems such as high definition television (HDTV) systems typically use digital signal processing. As part of such digital signal processing, data is typically rearranged in a prescribed sequence prior to transmission, followed by restoration to the original sequence upon reception. This operation serves to spread or disperse the data in time in a predetermined sequence, such that a data loss during transmission does not result in a loss of contiguous data. Instead, any data lost is dispersed and is therefore more easily concealed or corrected. Apparatus used to rearrange the original data sequence prior to transmission is commonly referred to as an interleaver, and apparatus used to restore the original data sequence upon reception is referred to as a deinterleaver. The interleaving/deinterleaving process is well known. Scrambling, in contrast to interleaving, has as its main goal the randomizing of data and the dispersal of transmitter signal energy. This helps to minimize co-channel interference and enhance timing recovery in the receiver. Scrambling also facilitates channel distortion compensation by an equalizer in the receiver.

Different interleaving/deinterleaving algorithms are known. For example, European satellite systems currently employ an algorithm proposed by Forney as described in "*Burst-Correcting Codes for the Classic Bursty Channel,*" IEEE Transactions on Communications Technology, vol. COM-19, October 1971. A different algorithm proposed by Ramsey as described in "*Realization of Optimum Interleavers,*" IEEE Transactions on Information Theory, vol. IT-15, May 1970, is commonly used in the United States.

SUMMARY OF THE INVENTION

The present inventor has recognized that a single signal processing device, such as an integrated circuit (IC), can advantageously accommodate multiple deinterleaving functions within the context of an advanced television signal processing system, for example. In accordance with the principles of the invention, a digital signal processing network contains an adaptive deinterleaving network incorporating different types of deinterleaving functions. In a disclosed embodiment, a selected deinterleaving function controls read/write addressing of a single memory. This reduces the cost and complexity of the network, and facilitates the implementation of a deinterleaving network containing different deinterleaving functions within an IC. The deinterleaving function to be used in a given application may be selected by means external to the device containing the deinterleaving network, or by a programmed controller, for example. Further, which of the particular deinterleaving functions is selected is determined by the type of system in which the deinterleaver is used. The system type varies because of the different types of television signal transmission methods used. For example, a different type of broadcast satellite systems is used for carrying advanced television information in the United States than is used in Europe.

DETAILED DESCRIPTION OF THE DRAWINGS

Figure 1:
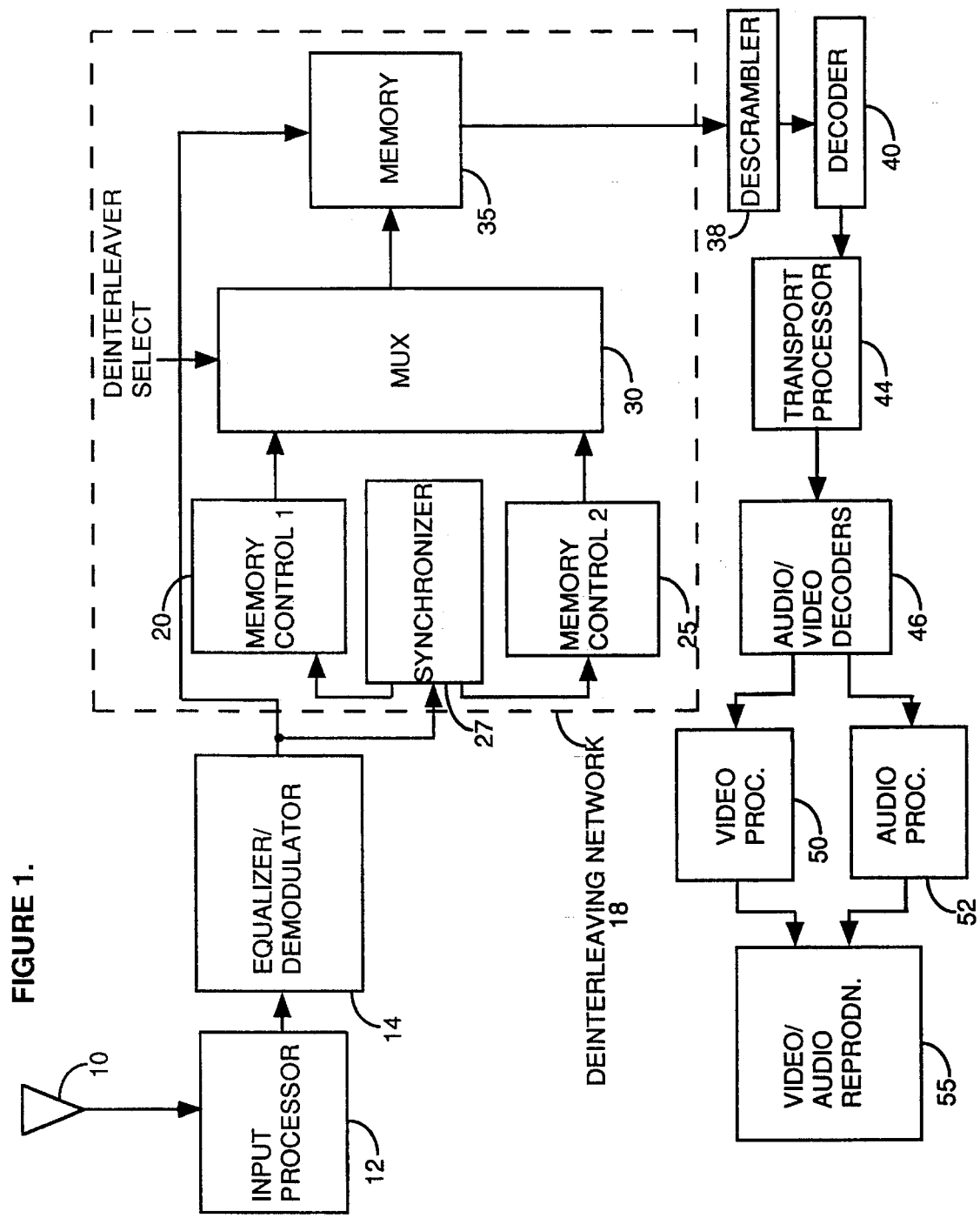
FIG. 1 is a block diagram of a portion of a HDTV receiver system including deinterleaving apparatus in accordance with the principles of the present invention.

FIG. 1 is a block diagram of a portion of a HDTV receiver including a deinterleaving network 18 according to the principles of the present invention. A transmitted HDTV signal received by an antenna 10 is applied to an input processor 12. Input processor 12 typically includes a tuner and IF stage for down-converting the received signal to a lower frequency band. It also may include automatic gain control, filtering, timing/clock recovery networks and other circuitry as known. The output signal from unit 12 is equalized and demodulated by unit 14. The equalization process compensates for distortions in the data channel as known. The demodulator function recovers the baseband interleaved data from the modulated input signal. Such equalizer and demodulator functions are well known and are described, for example, in the reference text *Digital Communication*, Lee and Messerschmidt (Kluwer Academic Press, Boston, Mass., USA, 1988).

The interleaved data from equalizer/demodulator 14 is applied to a synchronizer circuit 27 within deinterleaving network 18, and to a signal input of memory 35. Synchronizer circuit 27 detects sync words in the interleaved data signal and provides output signals synchronized to the data indicating when the data starts. The sync words are not themselves interleaved, but occur at periodic intervals in time. As an example, the interleaved data may consist of repeated data blocks containing a sync word followed by 15 data words. The synchronization function is accomplished, for example, by sync detection circuitry incorporating byte recognition logic and a phase-locked loop. The byte recognition logic recognizes the sync byte pattern, and the phase-locked loop tracks the sync bytes and indicates when a sync byte is expected. Therefore, synchronizer circuit 27 is able to provide output signals to first and second address and memory controllers 20 and 25 for synchronizing address signals applied to memory 35 via a multiplexer 30, with the input interleaved data applied to the signal input of memory 35.

Deinterleaving network 18 is configured such that controller 20 contains one deinterleaving function in the form of an algorithm, and controller 25 contains a different deinterleaving function also in the form of an algorithm. For example, controller 20 may implement the Ramsey deinterleaving function and controller 25 the Forney deinterleaving function. These deinterleaving functions may be implemented as logic state machines, i.e. as a cyclic sequence of logic operations, each assigned a state with the sequence being potentially responsive to inputs. Outputs generated by the state machine operation are a function of any combination of state, previous or present input signal or previous or present output signal. The required logic equations to implement the state machine operation are programmed into a logic structure acting as a memory using well known methods.

In this system only one of the two deinterleaving functions operates at a time, depending on the state of a Deinterleaver Select control signal. The Deinterleaver Select signal may be provided by various sources. Preferably this control signal is provided by a programmed microprocessor. Such a microprocessor has not been shown in FIG. 1 in order to simplify the drawing. The control signal may also be provided by a manually operated switch source, for example, located in the HDTV receiver and external to deinterleaving network 18. In that case the switch source applies a selected binary logic level directly to a designated input of deinterleaving network 18. Alternatively, the control signal may be decoded from a received interleaved data stream.

Controllers 20 and 25 produce a sequence of read and write addresses and associated memory control signals (such as read, write and output enable) which are passed via multiplexer 30 to memory 35. Memory 35 is essentially a shared memory which services whichever one of the two (or more) deinterleaving functions is selected. The addresses and associated memory control signals from controllers 20 and 25 are synchronized to the interleaved data input to memory 35 by the synchronization signals from synchronizer 27. The state of the Deinterleaver Select control signal input to multiplexer 30 determines which one of memory controller units 20 and 25 supplies memory address control signals to memory 35. Controllers 20, 25 produce respective memory write address control signals such that the input interleaved data is written into memory locations of memory 35 in the order in which the input interleaved data is received. Controllers 20 and 25 also produce respective memory read address signals to enable data to be read out of memory 35 in the desired deinterleaved order. This may be achieved, for example, by the state machine for the selected deinterleaver control unit producing the required sequence of addresses for reading the data out of memory 35. Thus in this example output data from memory 35 corresponding to the original (deinterleaved) data is produced as a function of a memory read process. The deinterleaving function may also be accomplished as a function of a memory write process, or as a function of both read and write processes.

The disclosed deinterleaver network 18 realizes an advantage by using a plurality of address and memory controllers with an associated (shared) memory. That is, only a single shared memory is required, regardless of the number of deinterleaver functions that are implemented and available for selection.

The deinterleaved data output from memory 35 is descrambled by unit 38. Descrambling, as distinct from deinterleaving, has as its main goal the de-randomizing of data. The randomizing of the data is performed prior to transmission to disperse the transmitter signal energy. This helps to minimize co-channel interference and enhance timing recovery in the receiver. It also facilitates channel distortion compensation by an equalizer in the receiver. The descrambled output of unit 38 is decoded by decoder 40, which may be a Reed-Solomon decoder, for example. Corrected data packets from unit 40 are applied to a transport processor 44, which examines the header of each data packet to identify audio and video data. Transport processor 44 conveys the audio and video output data to appropriate decoders within unit 46. Decoded audio and video signals from unit 46 are respectively applied to an audio processor 52 and to a television video processor 50. Processors 50 and 52 format the audio and video signals in a manner appropriate for reproduction by unit 55.

Figure 2:
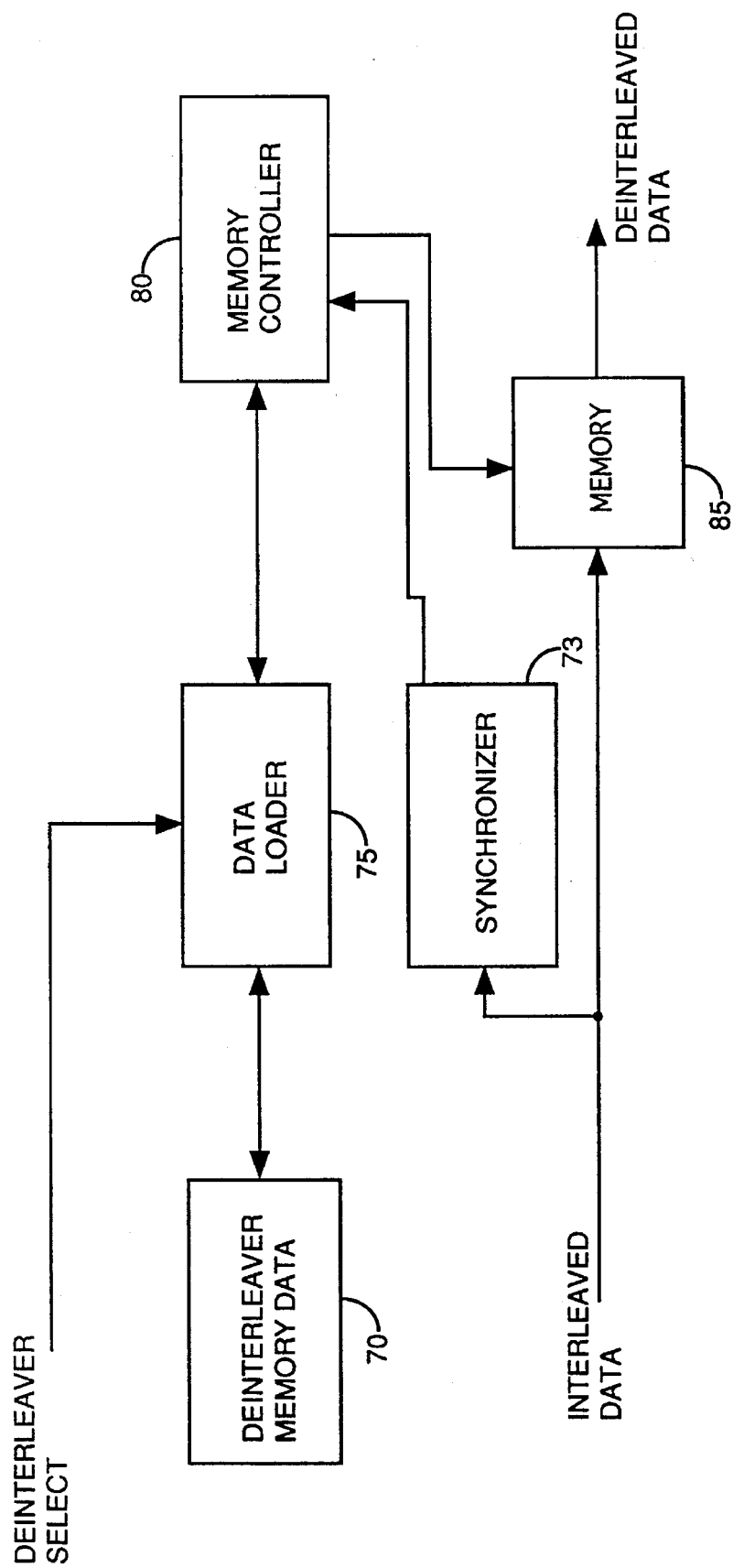
FIG. 2 shows an alternative implementation of deinterleaving apparatus according to the present invention.

Another embodiment of the invention is disclosed in FIG. 2. In this embodiment data needed to configure a memory controller to provide a desired deinterleaving function is contained within a memory 70. Memory 70 may contain more than one deinterleaving function. This data, e.g. an algorithm, is loaded into a memory controller 80 by a data loader 75. This may be performed, for example, by data loader 75 reading data from memory 70 and writing this data to memory locations within controller 80. Data loader 75 selects which deinterleaving function to load in response to a Deinterleaver Select control signal. This control signal may be provided from a variety of sources as mentioned in connection with the embodiment of FIG. 1. Data loader 75 initiates the load operation upon power-up of the system, or upon a change in the logic level of the Deinterleaver Select control signal.

Interleaved input data is applied to a synchronizer 73. Synchronizer 73 conveys sync signals to controller 80 for enabling controller 80 to synchronize memory address generation with the input interleaved data. The synchronization function is as described in connection with FIG. 1. Controller 80 produces write addresses so that the input interleaved data is written into the memory 85 in interleaved form. In addition, controller 80 produces read addresses to enable the stored data to be read out of memory 85 in the original deinterleaved order. That is, the read addressing of memory 85 is a function of deinterleaving data obtained from unit 70. The address generation function of controller 80 operates in the same way as described for controllers 20 and 25 in connection with FIG. 1.

Although the invention has been described in the context of a HDTV video signal processing system, it should be understood that the invention is applicable to other systems where different deinterleaving functions may be used, such as satellite and terrestrial broadcast systems. It should also be recognized that elements described in connection with FIGS. 1 and 2 may be arranged in various ways. For example, controllers 20, 25 and 80 may be implemented with microcontrollers or with discrete logic networks. In addition, the controllers 20 and 25 of FIG. 1 may share circuitry. Further, controllers 20, 25 and 80 of FIGS. 1 and 2 and may implement the deinterleaving address sequencing function in various ways. The deinterleaving function may be performed during the write cycle instead of during the read cycle described for the embodiment of FIG. 1. This write cycle deinterleaving is accomplished by writing the data to memory 35 or 85 locations in deinterleaved order, followed by reading the data from consecutive locations for output. Alternatively, the controllers may partially deinterleave the data during the write operation, while performing the remainder of the deinterleaving function during the read operation.

The Deinterleaver Select control signal may be used to disable the unused controller in FIG. 1. This may be desirable to reduce noise or power dissipation. The control signal may also be used to disable the outputs of the controller not in use, for example, by disabling output signal tri-state buffers of the controller not in use. In this case the output signal tri-state buffers of the controller in use are enabled, and the buffers of the controllers not in use are disabled. Multiplexer 30 would not be needed in this case.

More than one Deinterleaver Select control signal may be used. This may occur, for example, where two separate buffered versions of the same control signal are used by controllers 20 and 25. It may also occur when there are more than two address and memory controllers (each containing a different deinterleaving function) available for selection within deinterleaving network 18.

What is claimed is:

1. In a system for receiving a signal representative of interleaved digital video data, apparatus comprising:

an input processor having an input for receiving said signal representative of interleaved digital video data and for providing an interleaved data output;

a deinterleaving network responsive to said interleaved data output and for performing one of a plurality deinterleaving functions to produce a deinterleaved output signal, comprising:
- a) a source of a first deinterleaving function,
- b) a source of a different second deinterleaving function; and
- c) means for selecting one or the other of said deinterleaving functions in response to a control signal; and an output signal processor for processing said deinterleaved output signal.

2. Apparatus according to claim 1, wherein said deinterleaving network comprises:

a memory for receiving said interleaved data output, and for providing said deinterleaved output signal as an output;

a first memory control element, corresponding to said source of said first deinterleaving function, for controlling read and write addressing of said memory to implement said first deinterleaving function; and a second memory control element, corresponding to said source of said second deinterleaving function, for controlling read and write addressing of said memory to implement said second deinterleaving function.

3. Apparatus according to claim 2, wherein said selecting means selectively couples an output of one of said first or said second memory control elements to said memory in response to said control signal.

4. Apparatus according to claim 2, wherein a selected deinterleaving function is performed during said read addressing.

5. Apparatus according to claim 2, wherein a selected deinterleaving function is performed during said write addressing.

6. Apparatus according to claim 1, wherein said input processor includes an equalizer network and a demodulator network.

7. Apparatus according to claim 1, wherein said output processor includes:

a decoder network, and a video signal processor responsive to output signals from said decoder network.

8. In a system for receiving a signal representative of interleaved digital video data, apparatus comprising:

an input processor having an input for receiving said signal representative of interleaved digital video data and having an interleaved data output;

a memory having an input for receiving said interleaved data output, and an output;

a first memory control element for controlling read and write addressing of said memory to implement a first deinterleaving function, said first memory control element having an output and a synchronizing signal input;

a second memory control element for controlling read and write addressing of said memory to implement a different second deinterleaving function, said second memory control element having an output and a synchronizing signal input;

a synchronizer for receiving said interleaved data and for providing synchronizing signals to said synchronizing inputs of said first and second memory control elements for synchronizing said read and write addressing with said interleaved data;

means for selectively coupling one or other of said outputs of said first and said second memory control elements to said memory in response to a control signal; and an output signal processor for processing said output of said memory.

9. Apparatus according to claim 8, wherein said input processor includes an equalizer network and a demodulator network; and said output processor includes a decoder and a video processor responsive to decoded signals from said decoder.

* * * * *